(12) United States Patent
Inoue et al.

(10) Patent No.: US 6,885,094 B2
(45) Date of Patent: Apr. 26, 2005

(54) TEST CIRCUIT AND MULTI-CHIP PACKAGE TYPE SEMICONDUCTOR DEVICE HAVING THE TEST CIRCUIT

(75) Inventors: Kazutoshi Inoue, Tokyo (JP); Mitsuya Ohie, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/747,153

(22) Filed: Dec. 30, 2003

(65) Prior Publication Data

US 2004/0150414 A1 Aug. 5, 2004

Related U.S. Application Data

(62) Division of application No. 09/978,630, filed on Oct. 18, 2001, now Pat. No. 6,762,486.

(30) Foreign Application Priority Data

Oct. 20, 2000 (JP) ........................................ 2000-320643

(51) Int. Cl.[7] .............................................. H01L 23/02
(52) U.S. Cl. ......................... 257/686; 257/48; 257/693; 324/713
(58) Field of Search ........................... 257/48, 686, 685, 257/692, 693; 324/713

(56) References Cited

U.S. PATENT DOCUMENTS

| 5,908,304 | A | 6/1999 | Oudart et al. ................ 438/109 |
| 6,195,774 | B1 | 2/2001 | Jacobson ..................... 712/215 |
| 6,205,082 | B1 * | 3/2001 | Tomita et al. ............... 365/233 |
| 6,216,240 | B1 * | 4/2001 | Won et al. ................... 714/718 |

FOREIGN PATENT DOCUMENTS

| JP | 03-279880 | 12/1991 | ........... G01R/31/28 |
| JP | 04-250644 | 9/1992 | ........... H01L/21/66 |
| JP | 05-341014 | 12/1993 | ........... G01R/31/28 |

\* cited by examiner

Primary Examiner—Nathan J. Flynn
Assistant Examiner—Leonardo Andujar
(74) Attorney, Agent, or Firm—Junichi Mimura

(57) ABSTRACT

A MCP semiconductor device includes at least first and second chips, each of which has internal pads and an internal circuit, encapsulated by a sealing material together. The device further includes a test circuit. The test circuit connects each of the internal pads to one of the internal circuits under a normal operation mode of the device, and disconnect between them under a test mode.

4 Claims, 8 Drawing Sheets

TEST CIRCUIT AND MULTI-CHIP PACKAGE TYPE SEMICONDUCTOR DEVICE HAVING THE TEST CIRCUIT

CROSS-REFERENCE TO RELATED APPLICATION

This application claims the priority benefit of Japanese Patent Application No. 2000-320643, filed Oct. 20, 2000, the entire disclosure of which is incorporated herein by reference. This application is a division of applicant's application Ser. No. 09/978,630, Oct. 18, 2001 now U.S. Pat. No. 6,762,486.

BACKGROUND OF THE INVENTION

1. Field of the Invention

This invention relates to a test circuit capable of a multi-chip package type semiconductor device (MCP semiconductor device) and an MCP semiconductor device having the test circuit.

2. Description of the Related Art

In the related art, there are several types of multi-chip packages in which more than one IC chip can be packaged. One typical multi-chip package is a stack-type multi-chip package that packages at least two IC chips in a stacked manner as shown in FIG. 7. Another typical multi-chip package is a parallel-type multi-chip package that packages at least two IC chips in the same plane as shown in FIG. 8.

As shown in FIGS. 7 and 8, Each of the MCP semiconductor devices 1, 2 includes a first semiconductor chip (hereinafter "first chip") C101 and a second semiconductor chip (hereinafter "second chip") C102. The first chip C101 includes terminal pads P101 for internal connections (hereinafter "internal pads"), and terminal pads P111 for external connection (hereinafter "external pads"). The second chip C102 shown in FIG. 7 includes internal pads P102, and the second chip C102 shown in FIG. 8 includes internal pads P102 and external pad P112. Each of the internal pads P101 is connected to one of the internal pads P102 by a bonding wire BW. Each of the external terminal pads P111 and of the external terminal pads P112 are connected to one of external terminal 121 by a bonding wire BW.

A process of forming the MCP semiconductor device 2 shown in FIG. 8 includes a step for conveying the first chip C101 and second chip C102, and a step for mounting the first and second chips on a printed board. A process of forming the MCP semiconductor device 1 shown in FIG. 7 includes a step for conveying a first chip C101 and the second chip C102, and a step for mounting the second chip C102 on the first chip C101. In these steps, static electricity may be charged on the first and second chips C101, C102. While the static electricity may be charged on the first and second chips C101, C102, if the bonding wires BW are contacted with the internal and external pads P101, P102, P111, P112, surges may occur between the internal and external pads P101, P102, P111, P112 and the bonding wires BW. As a result, a peripheral circuit, which is formed near the pads, may be damaged by the surges. When the damage is critical to the peripheral circuit, it is possible to find an MCP semiconductor device having a damaged chip by a function test. However, when the damage is not so critical to a peripheral circuit, an MCP semiconductor device having a damaged chip may not be found by the function test because the damaged circuit operates normally. Since it is difficult to find an MCP semiconductor device having a damaged chip by a function test, an MCP semiconductor device having a damaged chip is found by measuring a leakage current. According to this measurement, a judgement as to whether an MCP semiconductor device has a damaged chip, can be made.

In an MCP semiconductor device having a single chip, since a terminal pad formed on the chip is connected directly to an external terminal of a lead flame placed outside of the MCP semiconductor device, it is easy to measure a leakage current at the terminal pad by applying a voltage having an H level (ex. power supply voltage) or applying a voltage having an L level (ex. ground voltage) to the external pad. However, in an MCP semiconductor device, at least two chips are formed, and these chips are connected to each other at some of their internal pads P101, P102 by the bonding wires BW, as shown in FIGS. 7 and 8. In other word, these internal pad P101, P102 are used for connecting the first chip C101 to the second chips C101, C102, and are not used for connecting the first and second chips C101, C102 to the external terminals 121. Therefore, it is impossible to measure leakage current on these internal pads P101, P102 by applying the predetermined voltage from the outside because these internal pads P101, P102 are not connected directly to the external terminal on which the predetermined voltage is applied.

Since it is impossible to measure a leakage current on these internal pads P101, P102 by the method described above, the judgement as to whether an MCP semiconductor device having a damaged chip, must rely on the function test. However, as described above, the function test may not be able to find a damaged chip when the damage is not critical. As a result, the MCP semiconductor device having the damaged chip may be manufactured, and then, incorporated in a system. In the worst case, the MCP semiconductor device having the damaged chip malfunctions, and it causes the system to malfunction.

To resolve this problem, it is proposed for an MCP semiconductor device that a consuming current (IDDS) be measured under the condition that an operation of all chips is halted. However, there are some problems with this measurement.

For example, if one of two chips is a programmable memory, it takes a long time to fix the highest bit in an address to "0" or "1". As a result, a long time is required for measuring the consuming current (IDDS) under the conduction that an operation of all chips is halted.

Further, if one of two chips is a memory, an electric current of a few mA flows in the chip when a chip select terminal is enabled. That is, when MCP semiconductor device includes a chip such as a memory chip or similar kinds, it may be impossible to set the value of the electric current to be caused to flow in the chip to zero ("0"), depending on the voltage level that is applied to each terminal. As a result, it is difficult to obtain accurate measurement results.

Moreover, if one of the two chips is an analog circuit such as an A/D converter, it is difficult to fix the internal pad P101, P102 to the predetermined voltage level.

As described above, it is not easy to test the internal terminal pads and their peripheral circuits formed on each chip, according to the structure of the MCP semiconductor device

SUMMARY OF THE INVENTION

It is therefore an object of the invention to resolve the above-described problem in an MCP semiconductor device and provide an MCP semiconductor device having a test circuit for testing the MCP semiconductor device accurately and rapidly.

The object is achieved by an MCP semiconductor device including at least first and second chips encapsulated together by a sealing material. The first semiconductor chip includes a first internal circuit and a plurality of first internal terminal pads for transmitting signals to or from the first internal circuit. The second semiconductor chip includes a second internal circuit and a plurality of second internal terminal pads for transmitting signals to or from the second internal circuit. Each second internal pad is electrically connected to one the first internal terminal pads. The MCP semiconductor device further includes a test circuit, responsive to a voltage level of a test mode signal, selecting one from between the operations for prohibiting signal transmission between the first internal circuit and the first internal terminal pads and for allowing signal transmission between the first internal circuit and the first internal terminal pads, and selecting one from between the operations for prohibiting signal transmission between the second internal circuit and the second internal terminal pads and for allowing signal transmission between the second internal circuit and the second internal terminal pads.

Further, the object is achieved by an MCP semiconductor device having a test circuit for providing the test data, for storing a test result, and for connecting the external terminal pad to the internal terminal pad.

The above and further objects and novel features of the invention will more fully appear from the following detailed description, appended claims and accompanying drawings.

DETAILED DESCRIPTION OF THE PREFERRED EMBODIMENTS

In the first through fifth embodiments, the same reference numbers designate the same or similar components.

First Preferred Embodiment

Figure 1:
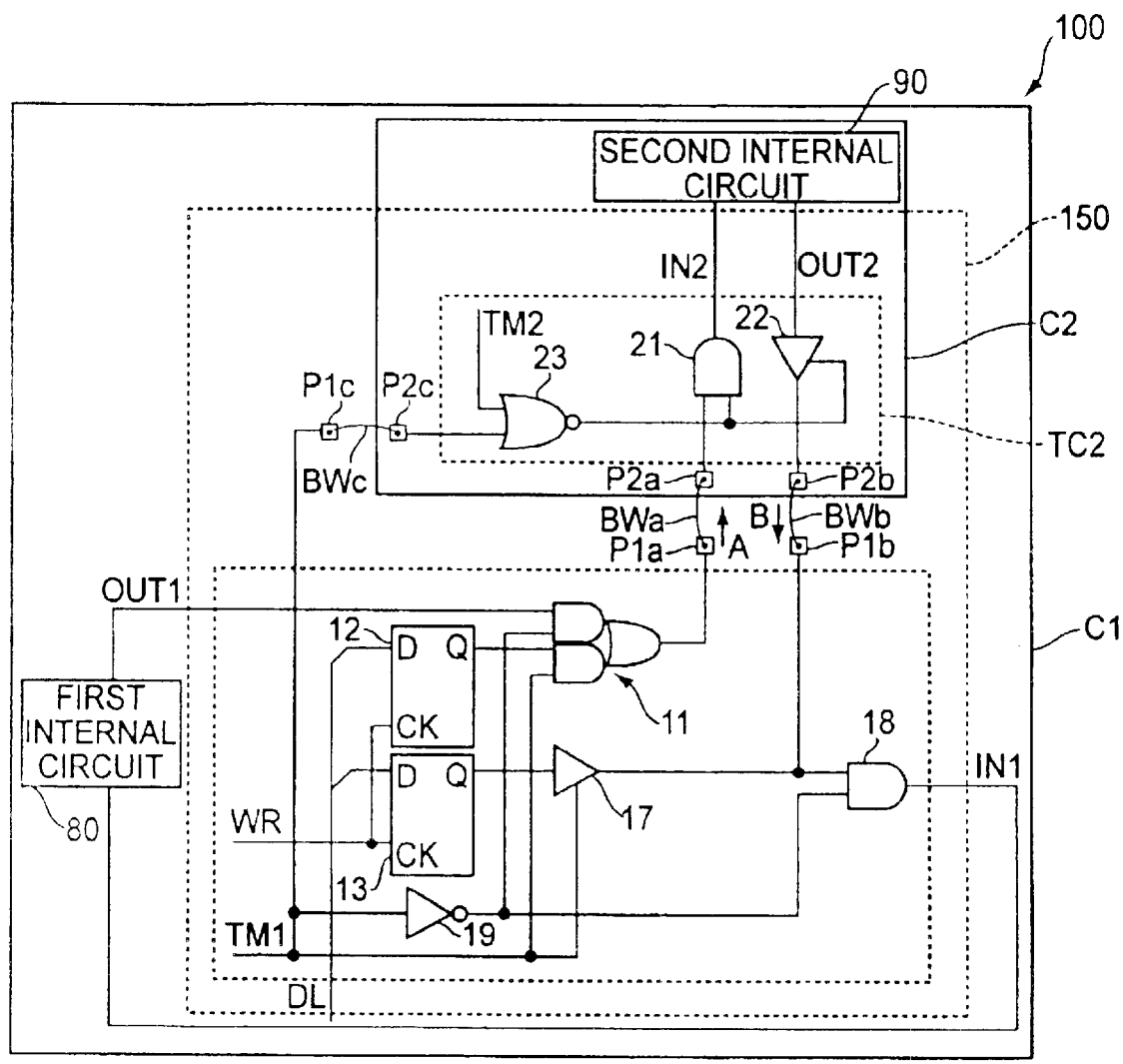
FIG. 1 is a circuit diagram of a test circuit formed in an MCP semiconductor device according to a first embodiment of the invention.

Referring to FIG. 1, a multi-chip package type semiconductor device (hereinafter "an MCP semiconductor device") 100 includes a first semiconductor chip (hereinafter "a first chip") C1 and a second semiconductor chip (hereinafter "a second chip") C2 mounted on the first chip C1.

The first chip C1 includes a first test circuit TC1 and internal terminal pads (hereinafter "internal pads") P1a, P1b, P1c. The second chip C2 includes a second test circuit TC2 and internal pads P2a, P2b, P2c. The internal pad P1a is connected to the internal pad P2a by a bonding wire BWa. The internal pad P1b is connected to the internal pad P2b by a bonding wire BWb. The internal pad P1c is connected to the internal pad P2c by a bonding wire BWc. In the normal operation of the MCP semiconductor device, a signal from the first chip C1 is transferred to the second chip C2 through the bonding wire BWa in the direction of an arrow A shown in FIG. 1. A signal from the second chip C2 is transferred to the first chip C1 through the bonding wire BWb in the direction of an arrow B shown in FIG. 1.

The internal pads P1a, P1b of the first chip C1 are connected to a first internal circuit 80 formed on the first chip C1, via the first test circuit TC1. The internal pads P2a, P2b of the second chip C2 are connected to a second internal circuit 90 formed on the second chip C2, via the second test circuit TC2.

A test circuit 150 is a combination of the first test circuit TC1 and the second test circuit TC2. The first test circuit TC1 includes a selector 11, a first test register 12, a second test register 13, a first output control circuit 17, a first input control circuit 18, and an inverter 19. The first test register 12 includes a data input terminal D, a write signal (WR) input terminal CK and an output terminal Q, and the second test register 13 includes a data input terminal D, a WR signal input terminal CK and an output terminal Q. The first input control circuit 18 includes a first input terminal and a second input terminal.

Responsive to a WR signal, the first and second registers 12, 13 receive data, each data element having an H level or an L level at its data input terminal D from a data line DL. If the MCP semiconductor device includes a microcomputer, an internal data bus corresponds to the data line DL.

Responsive to a first test mode signal TM1, the selector 11 selects one from between an output signal OUT1 from the first internal circuit 80 and an output signal from the second register 12, and outputs the selected signal to the internal pad P1a. The output terminal Q of the second register 13 is connected to an input terminal of the first output control circuit 17, which is controlled by the first test mode signal TM 1. An output terminal of the first output control circuit 17 is connected to the internal pad P1b.

The first input terminal of the first input control circuit 18 is connected to the internal pad P1b, and the second input terminal of the first input control circuit 18 is connected to output terminal of the inverter 19, which outputs the inverted signal of the first test mode signal TM1.

The second test circuit TC2 includes a second input control circuit 21 having first and second input terminals, a second output control circuit 22, and a test mode control circuit 23 having a first and second input terminals.

The first input terminal of the second input control circuit 21 is connected to the internal pad P2a, and the second input terminal of the second input control circuit 21 is connected to an output terminal of the test mode control circuit 23. An output terminal of the second input control circuit 21 is connected to the second internal circuit 90.

An input terminal of the second output control circuit 22 is connected to the second internal circuit 90, and the output terminal of the second output control circuit 22 is connected to the internal pad P2b. An control terminal of the second output control circuit 22 is connected to the output terminal of the test mode control circuit 23.

The test mode control circuit 23 receives a second test mode signal TM2 at its first input terminal, and receives the first test mode signal TM1 at its second input terminal via the internal pad P2c, the bonding wire BWc, and the internal pad P1c.

The operation of the MCP semiconductor device 100 having the structure described above, is explained below. In the normal operation of the MCP semiconductor device 100, the voltage levels of the first and second test mode signal TM1, TM2 are set at the L level.

While the first test mode signal TM1 is at the L level, the selector 11 selects the output signal OUT1 from the first internal circuit 80, and outputs it to the internal pad P1a. While the first test mode signal TM1 is at the L level, the output terminal of the first output control circuit 17 is in a high impedance state. Further, since the first test mode signal TM1 having the L level is inverted by the inverter 19, the first input control circuit 18 receives the signal having H level at it's the second input terminal.

In the meantime, since the test mode control circuit 23 receives the first and second test mode signals TM1, TM2 having L level at its first and second input terminals, the test mode control circuit 23 provides a signal having the H level to the second input terminal of the second input control circuit 21 and to the control terminal of the second output control circuit 22. Since the signal having the H level is inputted to the control terminal of the second output control circuit 22, the second output control circuit 22 provides the output signal OUT2 from the second internal circuit 90 to the internal pad P2b.

As described above, since the output signal OUT1 from the first internal circuit 80 is provided to the internal pad P1a, the output signal OUT1 is provided to the first input terminal of the second input control circuit 21 via internal pad P2a. Since the signal having the H level is inputted from the test mode control circuit 23 to the second input terminal of the second input control circuit 21 at this time, the voltage level of the output signal of the second input control circuit 21 is changed, responsive to the voltage level of the output signal OUT1, which is inputted to the first input terminal of the second input control circuit 21. Accordingly, the output signal OUT1 of the first internal circuit 80 in the first chip C1 is provided to the second internal circuit 90 in the second chip C2 as an input signal IN2.

Since the output signal OUT2 of the second internal circuit 90 formed in the second chip C2 is provided to the internal pad P2b, the output signal OUT2 is inputted to the first input terminal of the first input control circuit 18 via the bonding wire BWb and the internal pad P1b. Since the signal having the H level is inputted from the inverter 19 to the second input terminal of the first input control circuit 18 at this time, the voltage level of the output signal of the first input control circuit 18 is changed, responsive to the voltage level of the output signal OUT2, which is inputted to the first input terminal of the first input control circuit 18. Accordingly, the output signal OUT2 of the second internal circuit 90 in the second chip C2 is provided to the first internal circuit 80 in the first chip C2 as an input signal IN1. The description above is of the normal operation of the MCP semiconductor device 100 having the test circuit 150. Next, the test operation of the MCP semiconductor device 100 having the test circuit 150 is explained below. As described above, the leakage current is measured at the internal pad in the test mode operation.

The normal operation mode is changed to the test mode operation by changing the voltage levels of the first and second test mode signals TM1, TM2 from the L level to the H level.

While the first test mode signal TM1 is at the H level, the selector 11 selects the output signal from the first test register 12, and outputs it to the internal pad P1a. While the first test mode signal TM1 is at the H level, since the first output control circuit 17 is enabled, the output signal from the second test register 13 is provided to the internal pad P1b. Further, since the first test mode signal TM1 having the H level is inverted by the inverter 19, the first input control circuit 18 receives the signal having L level at it's the second input terminal. Therefore, the voltage level of the input signal IN1 inputted to the first internal circuit 80, is fixed to the L level.

In the meantime, since the test mode control circuit 23 receives the first and second test mode signals TM1, TM2 having H level at its first and second input terminals, the test mode control circuit 23 provides a signal having the L level to the second input terminal of the second input control circuit 21 and to the control terminal of the second output control circuit 22. Since the signal having the L level is inputted to the second input terminal of the second input control circuit 21, the voltage level of the input signal IN2, which is inputted to the second internal circuit 90, is fixed to the L level. Further, since the signal having the L level is inputted to the control terminal of the second output control circuit 22, the output terminal of the second output control circuit 22 is in the high impedance state.

By changing the voltage level of the write signal WR from the L level to the H level, the data having the H level or the L level on the data line DL is stored in the first and second test registers 12, 13. The first test register 12 outputs the signal having the H level or the L level to the selector 11, responsive to the voltage level of the stored data therein. As described above, during the test mode operation of the device 100, since the selector 11 selects the output signal from the first test register 12, the output signal from the first test register 12 is provided to the internal pad P2a via the internal pad P1a and the bonding wire BWa. On the other hand, the second test register 13 outputs the signal having the H level or the L level to the first output control circuit 17, responsive to the voltage level of the stored data therein. As described above, during the test mode operation of the device 100, since the first output control circuit 17 is enabled by applying the test mode signal TM1 having the H level to its control terminal, the output signal from the second test register 13 is provided to the internal pad P2b via the internal pad P1b and the bonding wire BWb.

In this state, the operation of the MCP semiconductor device 100 is halted (When the MCP semiconductor device 100 includes a microcomputer, the mode of the microcomputer is changed from the operation mode to the stop mode). If the internal pads P1a, P1b, P2a, P2b and their peripheral circuits are not damaged, a current is not caused to flow by applying signals having the H or L levels from the first and second test register 12, 13, to the internal pads P1a, P1b. Therefore, the consuming current (IDDS) in the condition that an operation of all chips is halted is almost zero "0" A when the MCP semiconductor device 100 has no defective chips.

However, if one of or all of the internal pads P1a, P1b, P2a, P2b and their peripheral circuits have defects having current leakage-passes by being damaged, the leakage current occurs by applying the H or L level signals, which are provided from the first and second test register 12, 13, to the internal pads P1a, P1b. As a result, the value of the consuming current (IDDS) is varied. When a variation of the consuming current (IDDS) is detected, it is judged that there are defects in one or more of the internal pads P1a, P1b, P2a, P2b and their peripheral circuits.

In the meantime, it is required that the amount of the consuming current in the first and second internal circuits 80, 90 be as small as possible when the consuming current (IDDS) is measured. Therefore, according to the first embodiment, the first and second input control circuits 18, 21 are formed by AND gates in order to fix the voltage levels of the input signals IN1, IN2 that are inputted to the first and second internal circuits 80, 90, respectively, to the L level. However, even if the voltage levels of the input signals IN1, IN2 are fixed to the L level by the AND gates, the current may flow into the first and second internal circuit 90 because of structures of the first and second internal circuits 80, 90. To avoid causing a flow of the current into the first and second internal circuits 80, 90 when the voltage levels of the input signals IN1, IN2 are fixed to the L level, the first and second input control circuits 18, 21 may be formed by NAND gates.

To determine whether the internal pads P1c, P2c and their peripheral circuits, which transfer the first test mode signal TM1 from the first chip C1 to the second chip C2, include a current leakage-pass or not, the following test is performed. First, the voltage level of the second test mode signal TM2 is maintained at the H level. In this state, the voltage level of the first test mode signal TM1 changes from the H level to the L level, and then, the consuming current (IDDS) is measured.

According to the test circuit 150 having the first and second test circuits TC1, TC2 of the first embodiment, by applying the signals having the H level or the L level to the internal pads P1a, P1b, P2a, P2b, which connect the first chip C1 to the second chip C2, the leakage current on the internal pads P1a, P1b, P2a, P2b can be measured in the condition that the operation of all chips is halted. As a result, it is easy to discover the existence of defective internal pads and defective peripheral circuits formed on the first and second chips C1, C2, so that the accuracy in identifying MCP semiconductor devices having the defective chips is increased.

Second Preferred Embodiment

In the first embodiment, the first and second test circuit TC1, TC2 are capable of the first and second chips C1, C2, each of which has two pairs of the internal pads (P1a & P1b and P2a & P2b) that transfer some signals. On the other hand, a test circuit 250 of the second embodiment is capable of a first and second chips, each of which has more than two pairs of the internal pads.

Figure 2:
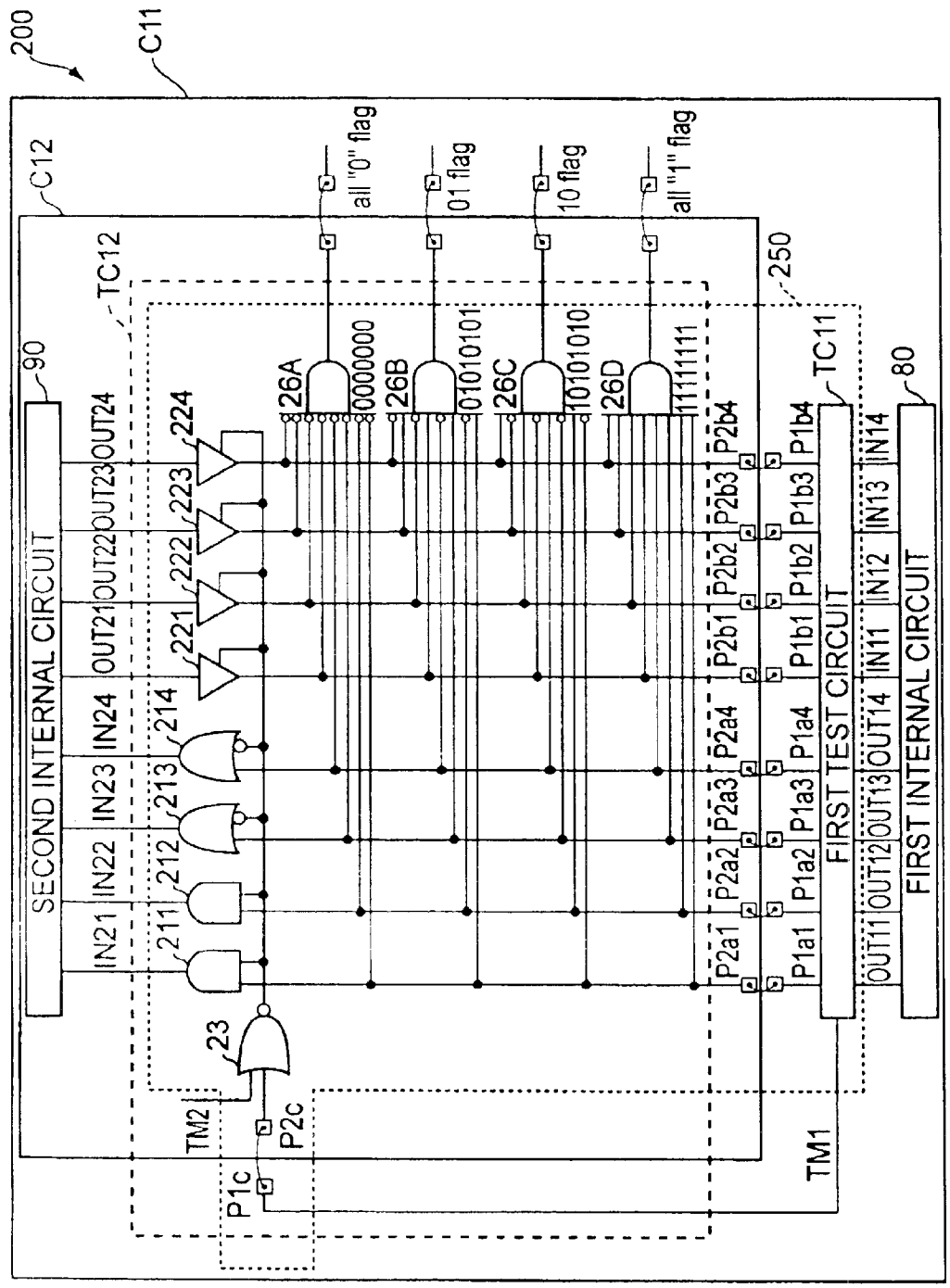
FIG. 2 is a circuit diagram of a test circuit formed in an MCP semiconductor device according to a second embodiment of the invention.

Referring to FIG. 2, an MCP semiconductor device 200 includes a first chip C11 and a second chip C12 mounted on the first chip C11. The first chip C11 includes internal pads P1a1, P1a2, P1a3, P1a4, P1b1, P1b2, P1b3, P1b4, P1c, and the second chip C12 includes internal pads P2a1, P2a2, P2a3, P2a4, P2b1, P2b2, P2b3, P2b4, P2c. Each of the internal pads P1a1 through P1a4 are connected to one of the internal pads P2a1 through P2a4 by a bonding wire, and each of the internal pads P1b through P1b4 are connected to one of the internal pads P2b1 through P2b4 by a bonding wire. Further, the internal pad P1c is connected to the internal pad P2c by wire bonding.

The internal pads P1a1 through P1a4 and P1b through P1b4 of the first chip C11 are connected to a first internal circuit 80 formed on the first chip C11 via a first test circuit TC11. The internal pads P2a1 through P2a4 and P2b1 through P2b4 of the second chip C12 are connected to a second internal circuit 90 formed on the second chip C12 via a second test circuit TC12.

The test circuit 250 is a combination of the first test circuit TC11 and the second test circuit TC12. The first test circuit TC11 includes four circuits, each of which is equivalence to the first test circuit TC1 disclosed in the first embodiment. Each of four circuits in the first test circuit TC11 is assigned to one of four pairs of the internal pads (P1a1&P1b1, P1a2&P1b2, P1a3&P1b3, P1a4&P1b4).

The second test circuit TC12 includes a first through fourth input control circuits 211, 212, 213, 214, a first through fourth output control circuits 221, 222, 223, 224, a test mode control circuit 23, and a first through fourth decoders 26A, 26B, 26C, 26D.

A first input terminal of each of the first through fourth input control circuits 211, 212, 213, 214 is connected to one of the internal pads P2a1, P2a2, P2a3, P2a4, and a second input terminal of each of the first through fourth input control circuits 211, 212, 213, 214 is connected to an output terminal of the test mode control circuit 23 commonly. An output terminal of each of the first through fourth input control circuits 211, 212, 213, 214 is connected to the second internal circuit 90 formed in the second chip C12.

In the case that no current flows at both of the output terminals of the first and second input control circuits 211, 212 when a first input signal IN 21 and a second input signal IN 22, which are provided to the second internal circuit 90 of the second chip C12, are in the L level, and that no current flows at both of the output terminals of the third and fourth input control circuits 213, 214 when a third input signal IN 23 and a fourth input signal IN 24, which are also provided to the second internal circuit 90 of the second chip C12, are in the L level because of the structure of the second internal circuit 90 formed in the second chip C12, the first and second input control circuits 211, 212 are formed by AND gates, and the third and fourth input circuits 213, 214 are formed by OR gates. By forming the first through fourth input control circuits 211, 212, 213, 214 as described above, the voltage levels of the first and second input signals IN21, IN22 are fixed to the L level, and the voltage levels of the third and fourth input signals IN23, IN24 are fixed to the H level when the mode of the MCP semiconductor device 200 is changed from the operation mode to the test mode. In other word, in the test mode operation, the current value at each output terminal of the first through fourth input control circuits 211, 212, 213, 214 is considered as zero "0".

An input terminal of each of the first through fourth output control circuits 221, 222, 223, 224 is connected to the second internal circuit 90 of the second chip C2, and an output terminal of each of them is connected to one of the internal pads P2b1, P2b2, P2b3, P2b4. The control terminals of the first through fourth output control circuits 221, 222, 223, 224 are commonly connected to the output terminal of the test mode control circuit 23.

The test mode control circuit 23 receives a second test mode signal TM2 at its first input terminal. The test mode control circuit 23 also receives a first test mode signal TM1 at its second input terminal via the internal pad P2c, the bonding wire, and the internal pad P1c.

The first though fourth decoders 26A, 26B, 26C, 26D decode the signal on the internal pads P2a1, P2a2, P2a3, P2a4, P2b1, P2b2, P2b3, P2b4, respectively.

The first decoder 26A outputs data "1", only when the voltage levels of the internal pads P2a1, P2a2, P2a3, P2a4, P2b1, P2b2, P2b3, P2b4 are at the L level (data "00000000").

The second decoder 26B outputs data "1", only when the voltage levels of the internal pads P2a1, P2a2, P2a3, P2a4, P2b1, P2b2, P2b3, P2b4 are at the L level, at the H level . . . at the L level and at the H level (data "01010101").

The third decoder 26C outputs data "1", only when the voltage levels of the internal pads P2a1, P2a2, P2a3, P2a4, P2b1, P2b2, P2b3, P2b4 are at the H level, at the L level . . . at the H level and at the L level (data "10101010").

The fourth decoder 26D outputs data "1", only when the voltage levels of the internal pads P2a1, P2a2, P2a3, P2a4, P2b1, P2b2, P2b3, P2b4 are at the H level (data "11111111").

The operation of the MCP semiconductor device 200 having the structure described above, is explained below. In the normal operation mode, since the operation of the MCP semiconductor device 200 is similar to that of the MCP semiconductor device 100 of the first embodiment, the explanation of the normal operation of the MCP semiconductor device 200 is omitted to avoid the overlapped description. Therefore, the explanation described below is as to the test mode operation of the MCP semiconductor device 200.

The normal operation mode is changed to the test mode operation by changing the voltage levels of the first and second test mode signals TM1, TM2 from the L level to the H level.

When the voltage level of the test mode signal TM1 is changed from the L level to the H level, eight registers send data having predetermined voltage levels to the internal pads P1a1, P1a2, P1a3, P1a4, P1b1, P1b2, P1b3, P1b4.

In the meantime, since the test mode control circuit 23 receives the first and second test mode signal TM1, TM2 having H level at its first and second input terminals, the test mode control circuit 23 provides a signal having the L level to the second input terminal of each of the first through fourth input control circuits 211, 212, 213, 214 and to the control terminal of each of the first through fourth output control circuits 221, 222, 223, 224. Since the signal having the L level is inputted to the second input terminal of each of the first through fourth input control circuits 211, 212, 213, 214, the voltage levels of the first and second input signals IN21, IN22, which are inputted to the second internal circuit 90, are fixed to the L level, and the voltage levels of the third and fourth input signals IN23, IN24, which also are inputted to the second internal circuit 90, are fixed to the H level. Further, since the signal having the L level is inputted to the control terminal of each of the first through fourth output control circuits 221, 222, 223, 224, the output terminals of them are in the high impedance state.

In this state, the MCP semiconductor device 200 is halted (When the MCP semiconductor device 200 includes a microcomputer, the mode of the microcomputer is changed from the operation mode to the stop mode). If the internal pads P1a1–P1a4, P1b1–P1b4, P2a1–P2a4, P2b1–P2b4 and their peripheral circuits are not damaged, the current does not occur by applying the signals having the H level or the L level, which are provided from the first test circuit TC11 to each internal pad. Therefore, the consuming current (IDDS) in the condition that an operation of all chips is halted is almost zero "0" A.

However, if one of or all of the internal pads and their peripheral circuits have defects having current leakage-passes by being damaged, the leakage current occurs by applying the signals having the H level or the L level, which are provided from the first test circuit TC11, to each internal pads. As a result, a value of the consuming current (IDDS) is varied. When the variation of the consuming current (IDDS) is found, it is judged that there are defects on one or more of the internal pads and their peripheral circuits.

The first through fourth decoders 26A, 26B, 26C, 26D are operated as follows. In order to test the condition of the internal pads P1a1–P1a4, P1b1–P1b4, P2a1–P2a4, P2b1–P2b4 and their peripheral circuits by using the first through fourth decoders 26A, 26B, 26C, 26D, eight test registers are considered as a single data storage member, and eight-bit data having the predetermined pattern is stored in the single data storage member. Then, the stored eight-bit data is provided to the internal pads P1a1–P1a4, P1b1–P1b4.

First, the eight-bit data ("00000000") is set in the eight test registers in order to let all of the voltage levels of the internal pads P1a1–P1a4, P1b1–P1b4 be at the L level. If the internal pads P1a1–P1a4, P1b1–P1b4, P2a1–P2a4, P2b1–P2b4 and their peripheral circuits are not damaged, since all of the voltage levels at the internal pad P1a1–P1a4 are at the L level, only the first decoder 26A of four decoders outputs a signal having the H level (all zero "0" flag), and each of the other decoders 26B, 26C, 26D outputs a signal having the L level. On the contrary, if one of or all of the internal pads P1a1–P1a4, P1b1–P1b4, P2a1–P2a4, P2b1–P2b4 and their peripheral circuits have defects having current leakage-passes by being damaged, the first decoder 26A outputs a signal having the L level.

Next, the eight-bit data ("01010101") is set in the eight test registers in order to let the voltage levels of the internal pads P1a1–P1a4, P1b1–P1b4 be at the L level, at the H level . . . at the L level and at the H level. If the internal pads P1a1–P1a4, P1b1–P1b4, P2a1–P2a4, P2b1–P2b4 and their peripheral circuits are not damaged, only the second decoder 26B of four decoders outputs a signal having the H level ("01" flag), and each of the other decoders 26A, 26C, 26D outputs a signal having the L level. On the contrary, if one of or all of the internal pads P1a1–P1a4, P1b1–P1b4, P2a1–P2a4, P2b1–P2b4 and their peripheral circuits have defects having current leakage-passes by being damaged, the second decoder 26B outputs a signal having the L level.

Next, the eight-bit data ("10101010") is set in the eight test registers in order to let the voltage levels of the internal pads P1a1–P1a4, P1b1–P1b4 be at the H level, at the L level . . . at the H level and at the L level. If the internal pads P1a1–P1a4, P1b1–P1b4, P2a1–P2a4, P2b1–P2b4 and their peripheral circuits are not damaged, only the third decoder 26C of four decoders outputs a signal having the H level ("10" flag), and each of the other decoders 26A, 26B, 26D outputs a signal having the L level. On the contrary, if one of or all of the internal pads P1a1–P1a4, P1b1–P1b4, P2a1–P2a4, P2b1–P2b4 and their peripheral circuits have defects having current leakage-passes by being damaged, the third decoder 26C outputs a signal having the L level.

Finally, the eight-bit data ("11111111") is set in the eight test registers in order to let all of the voltage levels of the internal pads P1a1–P1a4, P1b1–P1b4 be at the H level. If the internal pads P1a1–P1a4, P1b1–P1b4, P2a1–P2a4, P2b1–P2b4 and their peripheral circuits are not damaged, since all of the voltage levels at the internal pad P1a1–P1a4 are at the H level, only the fourth decoder 26D of four decoders outputs a signal having the H level (all one "1" flag), and each of the other decoders 26A, 26B, 26C outputs a signal having the L level. On the contrary, if one of or all of the internal pads P1a1–P1a4, P1b1–P1b4, P2a1–P2a4, P2b1–P2b4 and their peripheral circuits have defects having current leakage-passes by being damaged, the fourth decoder 26D outputs a signal having the L level.

Four-bit data as a output of the first through fourth decoder 26A, 26B, 26C, 26D is provided to the first test circuit TC11. When the four-bit data does not agree on an expected value mentioned above that is expected from the eight-bit data stored in the eight test registers formed in the first test circuit TC11, it is judged that the MCP semiconductor device 200 includes a damaged chip.

According to the second embodiment, in addition to the benefits of the first embodiment, since it is not necessary to perform the function test to find the defects of the internal pad, a test time can be reduced.

Further, according to the second embodiment, the voltage levels at the adjacent internal pads can be fixed to the predetermined voltage level accurately and rapidly by storing the appropriate data in the eight registers. Therefore, it is not only possible to set the voltage level of the signals, which are applied to all internal pads, at the H level or the L level, but also possible to applied the signal having the different voltage level to the adjacent internal pads. Specifically, by applying the signal having the different voltage level to the adjacent internal pads, it is further possible to find the electric short among the bonding wires or the disconnection of the bonding wires.

Furthermore, according to the second embodiment, although the input and output between the first chip C11 and the second chip C12 are performed by the eight internal pads of four pair formed in each chip, it is possible to apply the second embodiment to another MCP semiconductor chip having internal pads more than eight. In this case, by increasing a number of the input terminal of each decoder, responsive to the number of the internal pad, data appeared on each internal pad can be decoded without increasing the number of decoders.

Third Preferred Embodiment

Comparing to the MCP semiconductor device 100 having the test circuit 150 of the first embodiment, an MCP semiconductor device 300 includes a first chip C21 instead of the first chip C1 disclosed in the first embodiment, and the second chip C2. The first chip C21 includes a first test circuit TC21, and the second chip C2 includes the second test circuit TC2. The test circuit 350 is a combination of the first test circuit TC21 and the second test circuit TC2

Figure 3:
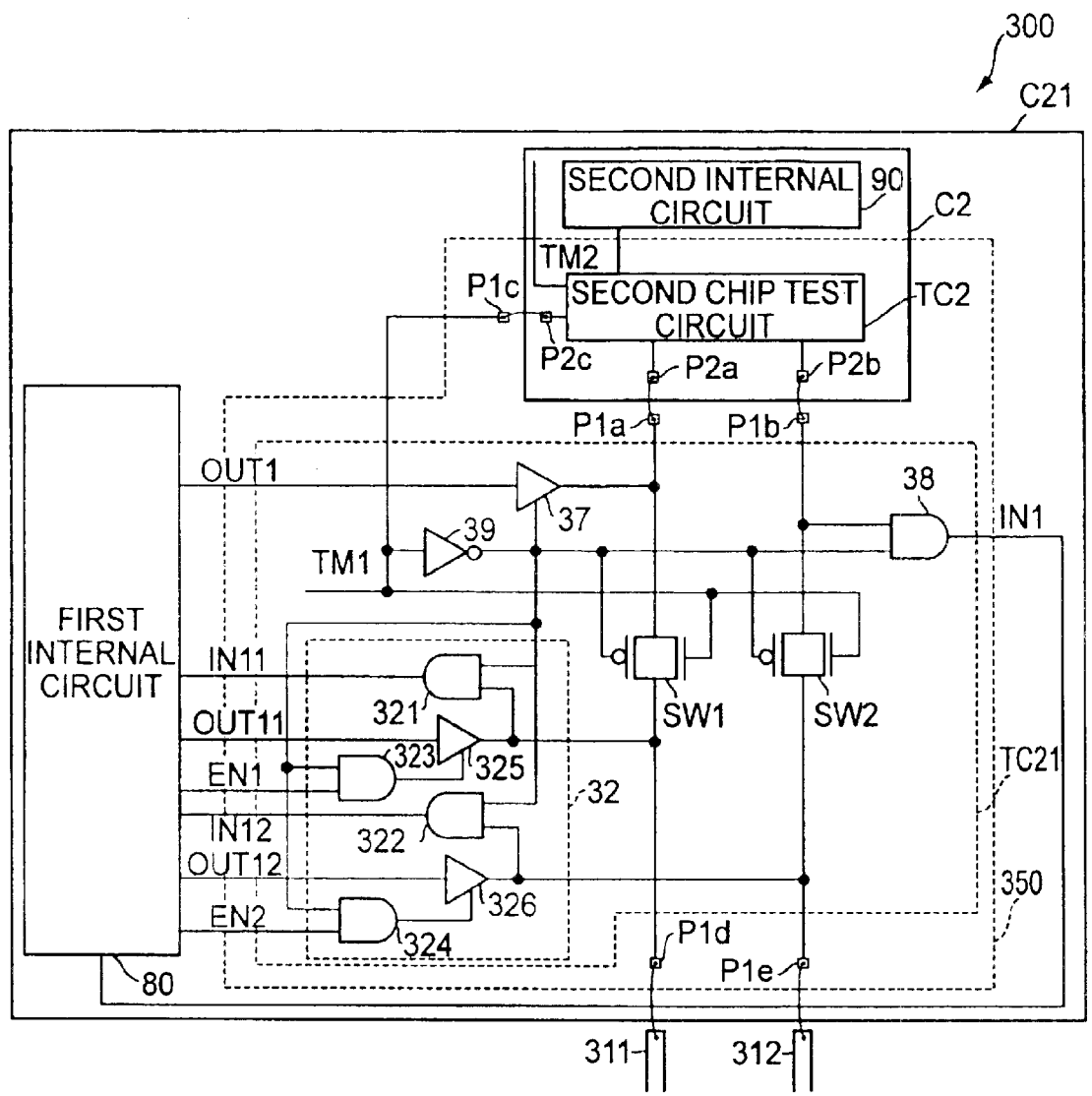
FIG. 3 is a circuit diagram of a test circuit formed in an MCP semiconductor device according to a third embodiment of the invention.

Referring to FIG. 3, the first test circuit TC21 includes first and second analog switches SW1, SW2, an external terminal control circuit 32, a first 3-state buffer 37 having one input terminal, one output terminal and one control terminal, a first AND gate 38 having two inputs and one output, and an inverter 39.

The external terminal control circuit 32 includes second through fifth AND gates 321, 322, 323, 324, each having two inputs and one output, and second and third 3-state buffers 325, 356, each having one input, one output and one control terminal.

The first analog switch SW1 includes a transfer gate, and selects connection or disconnection between an internal pad P1a and an external pad P1d. As well as the first analog switch SW1, the second analog switch SW2 also includes a transfer gate, and selects connection or disconnection between an internal pad P1b and an external pad P1e. Both of the first and second analog switch SW1, SW2 are controlled by a first test mode signal TM1 and the inverted signal of the first test mode signal TM1, which is generated by the inverter 39. When the mode of the MCP semiconductor device 200 is changed from the operation mode to the test mode by changing the voltage level of the first test mode signal TM1 from the L level to the H level, the first and second analog switch SW1, SW2 turn on. Therefore, in the test mode operation, the internal pads P1a, P1b are electrically connected to the external pads P1d, P1b, which are connected to external terminals 311, 312 of a lead frame.

The input terminal of the 3-state buffer 37 is connected to a transfer line of an output signal OUT1 from a first internal circuit 80 formed in the first chip C21, and the output of the 3-state buffer 37 is connected to the internal pad P1a. The control terminal of the 3-state buffer 37 is connected to the output terminal of the inverter 39 that outputs the inverted signal of the first test mode signal TM1.

The first input terminal of the first AND gate 38 is connected to the internal pad P1b, and its second input terminal is connected to the output terminal of the inverter 39. The output terminal of the first AND gate 38 is connected to a transfer line of an input signal IN1 to the first internal circuit 80 formed in the first chip C21.

Each of the first input terminal of the second through fifth AND gates 321, 322, 323, 324, which is formed in the external terminal control circuit 32, is connected to the output terminal of the inverter 39 commonly. The second input terminal of the second AND gate 321 is connected to the external pad P1d, and its output is connected to a transfer line of an input signal IN11 to the first internal circuit 80. The second input terminal of the third AND gate 322 is connected to the external pad P1e, and its output is connected to a transfer line of an input signal IN12 to the first internal circuit 80. The second input terminal of the fourth AND gate 323 is connected to a transfer line of a first enable signal EN1, and its output is connected to the control terminal of the second 3-state buffer 325. The second input terminal of the fifth AND gate 324 is connected to a transfer line of a second enable signal EN2, and its output is connected to the control terminal of the third 3-state buffer 326. The functions of the external pads P1e, P1e are changed by the first and second enable signal EN1, EN2. That is, when the voltage levels of the first and second enable signal EN1, EN2 are at the L level, the output terminals of the second and third 3-state buffer 325, 326 are in the high impedance state without responding the signals OUT11, OUT12 because the fourth and fifth AND gates 323, 324 output the signals, each having the L level. Thus, the signals provided from the external terminals 311, 312 are provided to the first internal circuit 80 via the first and second AND gates 321, 322. In this state, the external pads P1e, P1e are acting as input pads. On the contrary, when the voltage levels of the first and second enable signal EN1, EN2 are at the H level, the output terminals of the second and third 3-state buffer 325, 326 output the signals corresponding to the signals OUT11, OUT12 because the fourth and fifth AND gates 323, 324 output the signals, each having the H level. Thus, the signals from the first internal circuit 80 are outputted from the external terminals 311, 312. In this state, the external pads P1e, P1e are acting as output pads.

The input terminal of the second 3-state buffer 35, which is disposed in the external terminal control circuit 32, is connected to a transfer line of an output signal OUT11 being sent from the first internal circuit 80 formed in the first chip C21, and its output terminal is connected to the external pad P1d. The input terminal of the third 3-state buffer 326 is connected to a transfer line of an output signal OUT12 being sent from the first internal circuit 80 formed in the first chip C21, and its output terminal is connected to the external pad P1e.

The operation of the MCP semiconductor device 300 having the structure described above, is explained below. In the normal operation, the voltage levels of the first and second test mode signal TM1, TM2 are set at the L level.

While the first test mode signal TM1 is at the L level, both of the analog switches SW1, SW2 are in off-state. Thus, the internal pads P1a, P1b are disconnected from the external pads P1d, P1e electrically. On the other hand, in this state, each of the first terminals of the second through fifth AND gate 321, 322, 323, 324 is in the active state (H level) because the voltage level of the first test mode signal TM1 is inverted from the L level to the H level by the inverter 39, and because the inverted signal is inputted to the first input terminals of the second through fifth AND gate 321, 322, 323, 324.

When the external pads P1d, P1e are used for receiving signals from the external terminals 311, 312, the voltage levels of the first and second enable signals are set at the L level. Thus, since the output signal having the L level from the fourth AND gate 323 is inputted to the control terminal of the second 3-state buffer 325, and since the output signal having the L level from the fifth AND gate 324 is inputted to the control terminal of the third 3-state buffer 326, the output terminals of the second and third 3-state buffers 325, 326 are in the high impedance state.

The signal inputted from the external terminal 311 is provided to the first internal circuit 80 of the first chip C21 as the input signal IN11 via the internal pad P1d and the second AND circuit 321. The signal inputted from the external terminal 312 also is provided to the first internal circuit 80 of the first chip C21 as the input signal IN12 via the internal pad P1e and the third AND circuit 322.

On the contrary, when the external pads P1d, P1e are used for sending signals to the external terminal 311, 312, the voltage levels of the first and second enable signals are set at the H level. Thus, since the output signal having the H level from the fourth AND gate 323 is inputted to the control terminal of the second 3-state buffer 325, and since the output signal having the H level from the fifth AND gate 324 is inputted to the control terminal of the third 3-state buffer 326, the second and third 3-state buffers 325, 326 are in the active state.

The output signal OUT11 outputted from the first internal circuit 80 of the first chip C21 is provided to the external terminal 311 via the second 3-state buffer 325, and the internal pad P1d. The output signal OUT12 outputted from the first internal circuit 80 of the first chip C21 is provided to the external terminal 312 via the third 3-state buffer 326, and the internal pad P1e.

The operation of the MCP semiconductor device 300 in the normal operation is described above. Then, the operation of the MCP semiconductor device 300 in the test mode operation is described below.

The normal operation mode is changed to the test mode operation by changing the voltage levels of the first and second test mode signals TM1, TM2 from the L level to the H level.

When the voltage level of the first test mode signal TM1 is changed from the L level to the H level, since both of the analog switches SW1, SW2 in the first test circuit TC21 turn on, the internal pads P1a, P1b are connected to the external pads P1d, P1e electrically. Further, since the voltage level of the first test mode signal TM1 is inverted from the H level to the L level by the inverter 39, the signal having the L level is inputted to each of the first terminals of the second through fifth AND gate 321, 322, 323, 324. Thus, the signal inputted from the external terminals 311, 312 are not provided to the first internal circuit 80 in the first chip C21, and the voltage level of the input signals IN11, IN12 are fixed to the L level. Further, since the inverted signal from the inverter 39 is inputted to the fourth and fifth AND gates whose outputs are connected to the second and third 3-state buffers 325, 326, the output signals OUT11, OUT12 from the first internal circuit 80 are not provided to the internal pads P1a, P1b and the external pads P1d, P1e because the output terminals of the second and third 3-state buffers 325, 326 are in the high impedance state.

In the third embodiment, although the second and third AND gates 321, 322 are used, the other logic circuits may be used, responsive to the specification of the first internal circuit 80 of the first chip C21 if the other logic circuits does not flow any current at their output terminals in the test mode operation.

When the voltage level of the first test mode signal TM1 is changed from the L level to the H level, since the voltage level of the signal, which is inputted to the control terminal of the first 3-state buffer 37, is fixed to the L level, the output terminal of the first 3-state buffer 37 is in high impedance state. Thus, the output signal OUT11 from the first internal circuit 80 of the first chip C21 is not provided to the internal pads P1a because the output terminal of the first 3-state buffer 37 is in high impedance state. Further, since the inverted signal from the inverter 39 having the L level is inputted to the second input terminal of the first AND gate 38, the output terminal of the first AND gate 38 is fixed to the L level. Therefore, no current flows at the output terminal of the first AND gate 38.

In this state, leakage current at the internal pads P1a, P1b, P2a, P2b and their peripheral circuits is measured. To perform the measurement of the leakage current, it is necessary to apply signal having a predetermined voltage level (H or L) to the internal pads P1a, P1b. However, according to this embodiment, the external terminals 311, 312 that are located outside of the MCP semiconductor device 300 is connected to the internal pads P1a, P1b directly in the test mode operation. Therefore, even if the signals having the predetermined voltage level are applied to the external terminals 311, 312, it is possible to fix logic levels at the internal pads P1a, P1b.

According to the test circuit 350 of the third embodiment, it is possible to measure the leakage current at the internal pads P1a, P1b, P2a, P2b and their peripheral circuits by applying the signals having the predetermined voltage level from the external terminals 311, 312 to the internal pads P1a, P1b, P2a, P2b, which connect the first chip C21 to the second chip C2. As a result, it is easy to find the existence of the defective internal pads or the defective peripheral circuits formed on the first and second chips C1, C2 so that the accuracy for picking up the MCP semiconductor device having the defective chip is increased.

Fourth Preferred Embodiment

Figure 4:
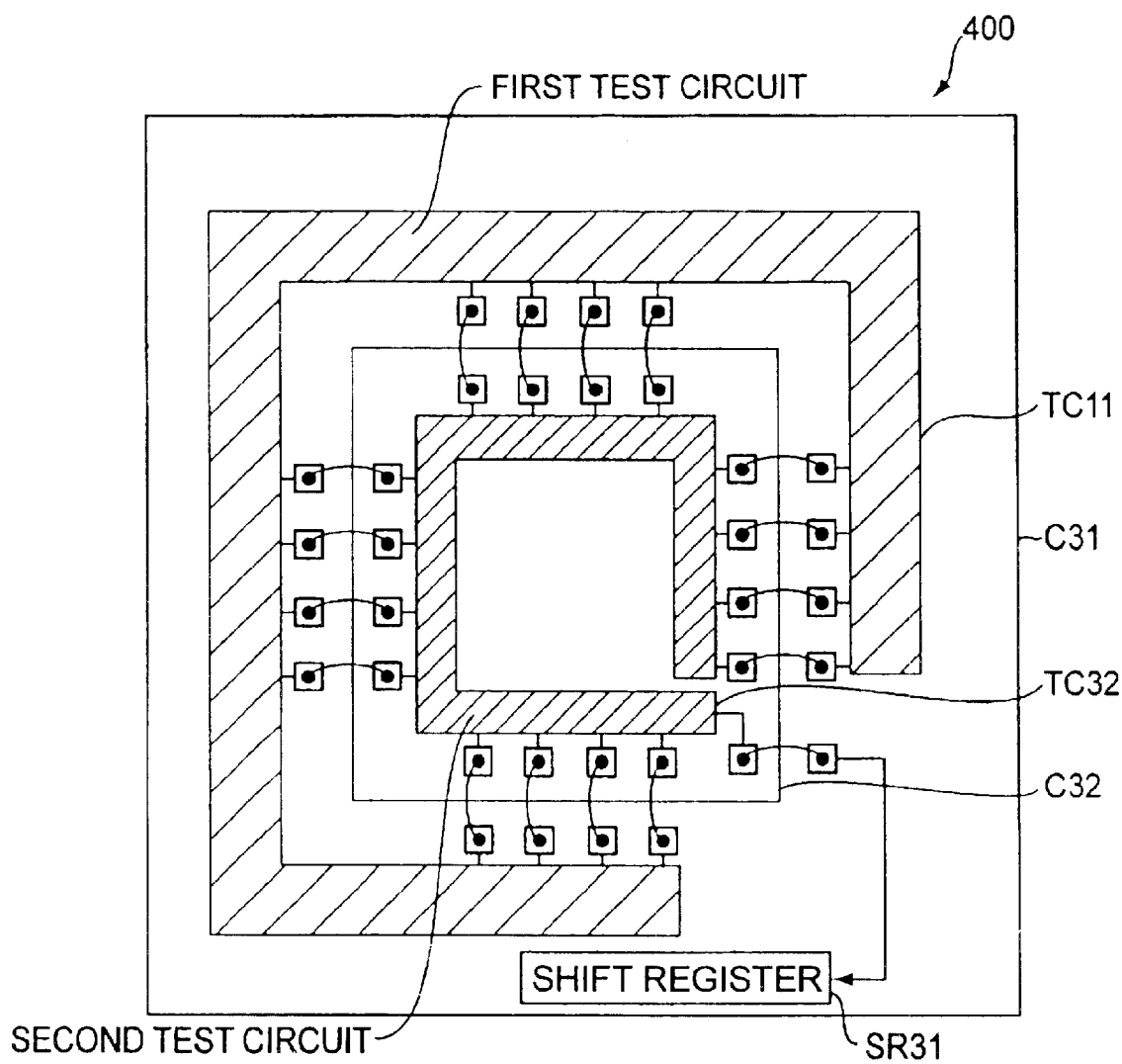
FIG. 4 is an internal plan view of an MCP semiconductor device having a test circuit according to a fourth embodiment of the invention.
Figure 5:
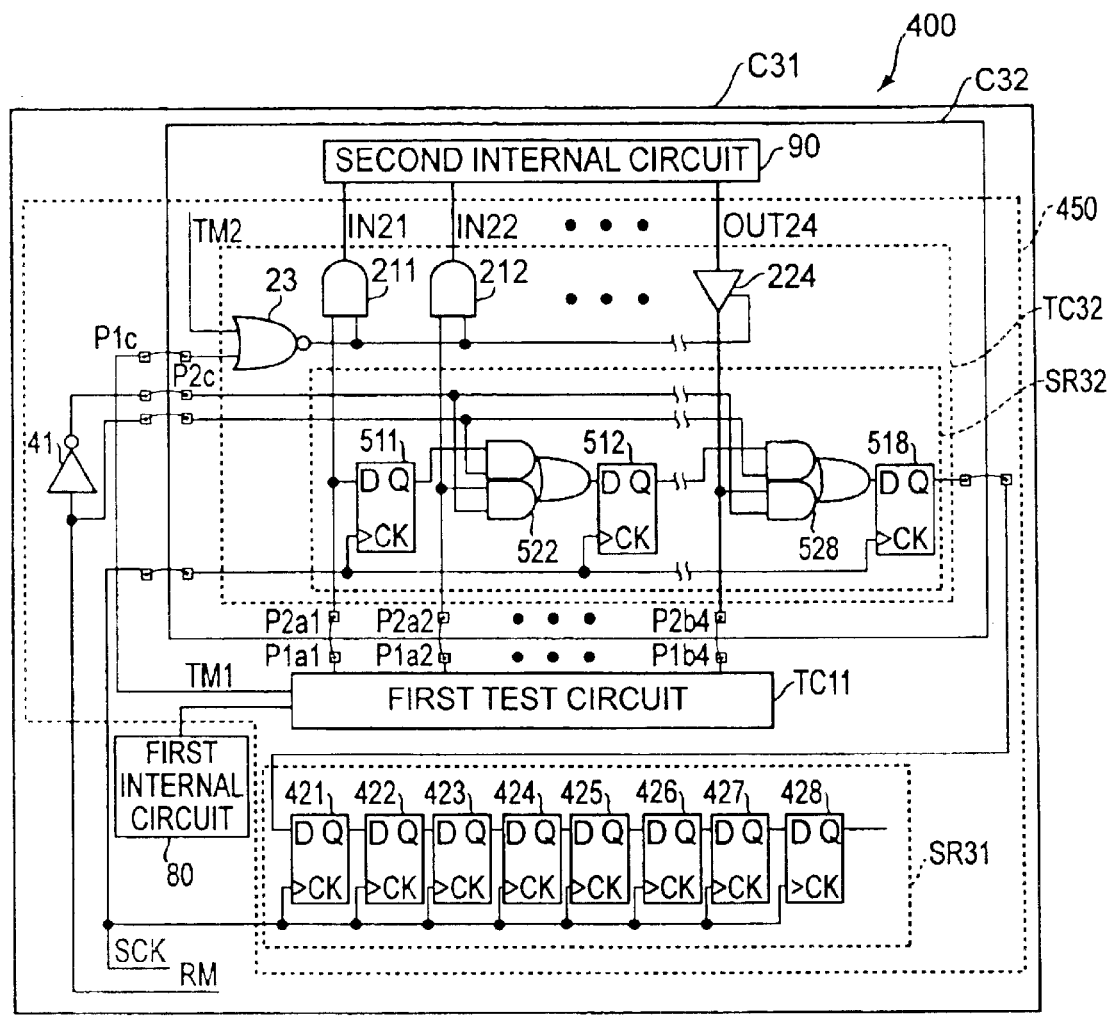
FIG. 5 is a circuit diagram of the test circuit formed in the MCP semiconductor device according to the fourth embodiment of the invention.

Referring to FIGS. 4 and 5, an MCP semiconductor device 400 includes a first chip C31 and a second chip 32, which is mounted on the first chip C31. The first chip C31 includes a first test circuit TC11, which is the same as the first test circuit TC11 disclosed in the second embodiment, a first shift register SR 31 and an inverter 41. The second chip C32 includes a second test circuit TC32. Comparing to the second test circuit TC 12 disclosed in the second embodiment, the second test circuit TC32 of the fourth embossment includes a second shift resistor SR 32 as a replacement of the first and fourth decoders 26A, 26B, 26C, 26D disclosed in the second embodiment. A test circuit 450 is a combination of the first test circuit TC11, the first shift register SR31, the inverter 41 and the second test circuit TC32.

Referring to FIG. 5, the second shift register SR32 in the second test circuit TC32 includes first through eighth register 511, 512, 513, 514, 515, 516, 518, 518, each of which includes D-type flip flop circuit. Each register 511-518 includes a data input terminal D, a shift clock signal (SCK) input terminal CK and an output terminal Q. Each register 511-518 corresponds to one of eight internal pads P2a1, P2a2, P2a3, P2a4, P2b1, P2b2, P2b3, P2b4. Further, the data input terminal D of each of the second through eight registers 512-518 is connected to one of seven selectors 522, 523, 524, 525, 526, 527, 528. The first through seventh selectors 522-528 are controlled by a shift register mode setting signal RM. The first selector 522 selects one from between the output signal of the first register 511 and a signal provided to the internal pad P2a2, and outputs the selected signal to the data input terminal D of the second register 512. The second selector 523 selects one from between the output signal of the second register 512 and a signal provided to the internal pad P2a2, and outputs the selected signal to the data input terminal D of the third register 513. The third selector 524 selects one from between the output signal of the third register 513 and a signal provided to the internal pad P2a3, and outputs the selected signal to the data input terminal D of the fourth register 514. The fourth selector 525 selects one from between the output signal of the fourth register 514 and a signal provided to the internal pad P2a4, and outputs the selected signal to the data input terminal D of the fifth register 515. The fifth selector 526 selects one from between the output signal of the fifth register 515 and a signal provided to the internal pad P2b1, and outputs the selected signal to the data input terminal D of the sixth register 516. The six selector 527 selects one from between the output signal of the sixth register 516 and a signal provided to the internal pad P2b2, and outputs the selected signal to the data input terminal D of the seventh register 517. The seventh selector 528 selects one from between the output signal of the seventh register 517 and a signal provided to the internal pad P2b3, and outputs the selected signal to the first shift register SR31.

The first shift register 31 includes eight registers 421, 422, 423, 424, 425, 426, 427, 428 for storing data outputted from the second shift register 32 serially.

The operation of the MCP semiconductor device 400 having the structure described above, is explained below. In the normal operation mode, since the operation of the MCP semiconductor device 400 is similar to that of the MCP semiconductor device 200 of the second embodiment, the explanation of the normal operation of the MCP semiconductor device 400 is omitted to avoid the overlapped description. Therefore, the explanation described below is as to the test mode operation of the MCP semiconductor device 400.

The normal operation mode is changed to the test mode operation by changing the voltage levels of the first and second test mode signals TM1, TM2 from the L level to the H level.

As explained in the second embodiment, data having predetermined pattern such as "00000000", "01010101", "10101010" or "11111111" is set in unillustrated eight test registers disposed in the first test circuit TC11. The data having predetermined patterns is outputted to the internal pads P1a1-P1a4, P1b1-P1b4 formed on the first chip C31. Each signal on the internal pads P1a1-P1a4, P1b1-P1b4 are provided to one of the internal pads P2a1-P2a4, P2b1-P2b4 formed on the second chip C32 via a bonding wire.

In this state, the voltage level of the shift register mode setting signal RM is set to the L level. By setting the voltage level of the signal RM to the L level, each of the first through seven selectors 522-528 selects the signal provided to each of eight internal pads P2a1-P2a4, P2b1-P2b4. Further, in this state, when one pulse of a shift clock signal SCK is inputted to each of the first through eighth registers 511-518 in the second shift register SR32, the data provided to eight internal pads P2a1-P2a4, P2b1-P2b4 is stored in the first through eighth registers 511-518.

Next, while the voltage level of the shift register mode setting signal RM is changed from the L level to the H level, the shift clock signal SCK is continuously applied to each of the first through eighth registers 511-518. In synchronized with the first one pulse of the shift clock signal SCK, each data stored in one of the first through seven registers 511-517 is transferred to the second through eight resistors 512-518, each of which is the next stage of one of the first through seven registers 511-517. The shift clock signal SCK also is applied to each of the first through eighth registers 421-428 in the first shift register SR31. Therefore, the data stored in the eighth register 518, which is the last stage of the second shift register SR32, is transferred to and stored in the first register 421, which is the first stage of the first shift register SR31.

Since the eight registers are used in each of the first and second shift register SR31, SR32, after eight pulses of the shift clock signal SCK are provided to the first and second shift register SR31, SR32, the data-transfer from the second shift register SR32 to the first shift register SR31 has been completed.

Then, the data stored in the eight test registers in the first test circuit TC11 is compared with the transferred data stored in the first shift register SR31. When the data are compared, the data stored in the first shift register SR31 may be outputted as 8-bit parallel data at one time, and the data stored in the first shift register SR31 may be outputted serially by applying the shift clock signal SCK to the first through eighth registers 421-428 in the first shift register SR31. If the data stored in the eight test registers in the first test circuit TC11 does not agree on the data stored in the first shift register SR31, it is judged that the MCP semiconductor device 400 includes a damaged chip.

Figure 6:
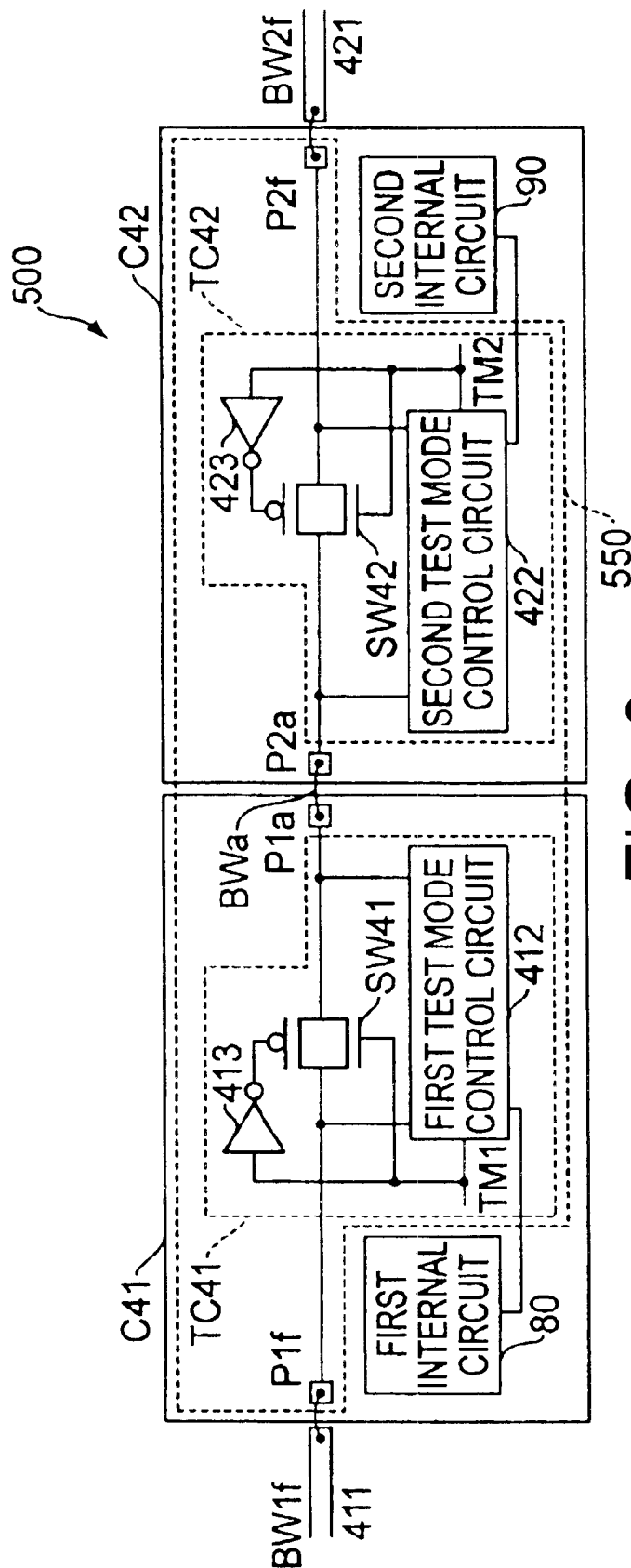
FIG. 6 is a circuit diagram of a test circuit formed in an MCP semiconductor device according to a fifth embodiment of the invention.
Figure 7:
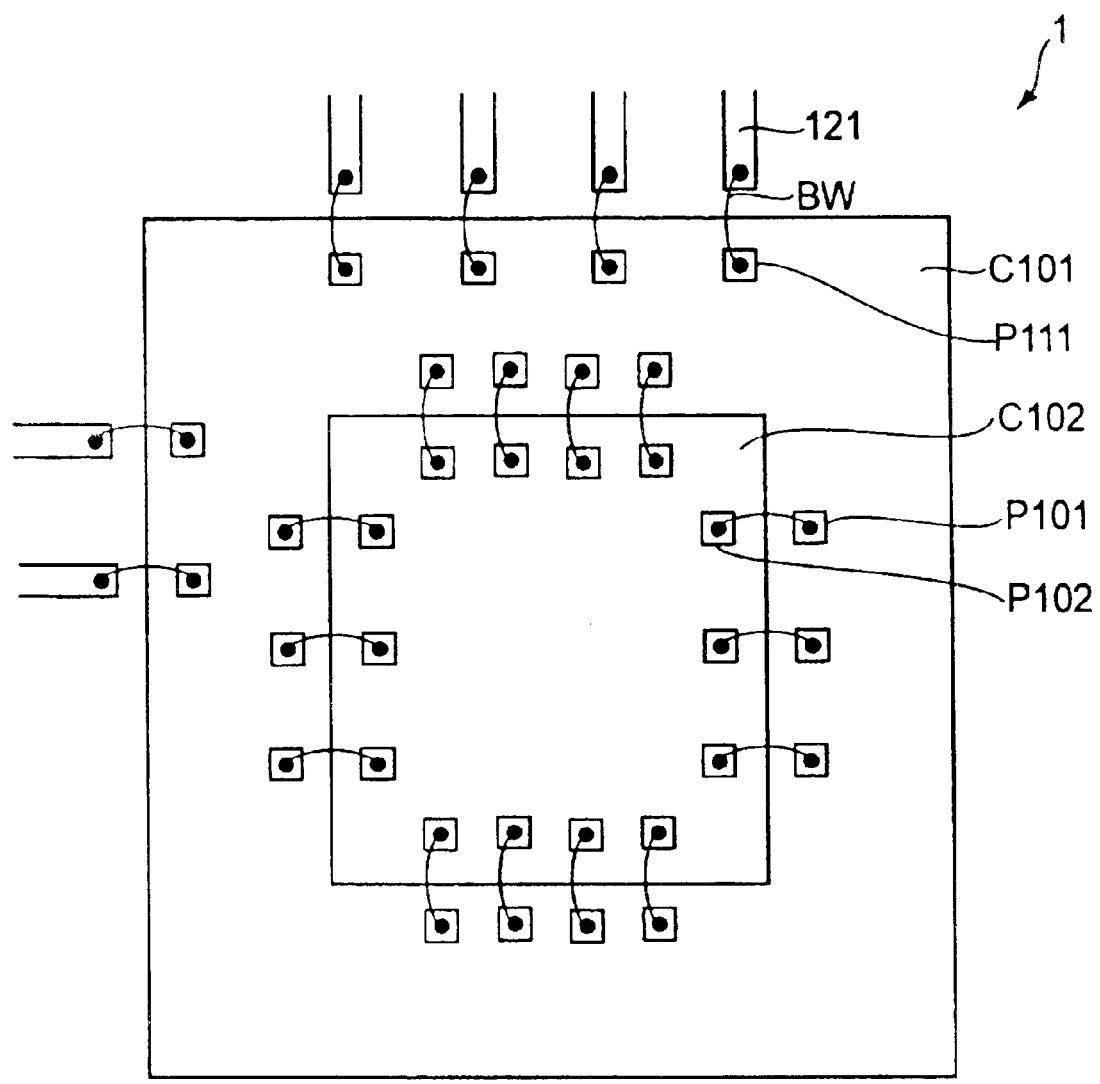
FIG. 7 is an internal plan view of an MCP semiconductor device in the related art.
Figure 8:
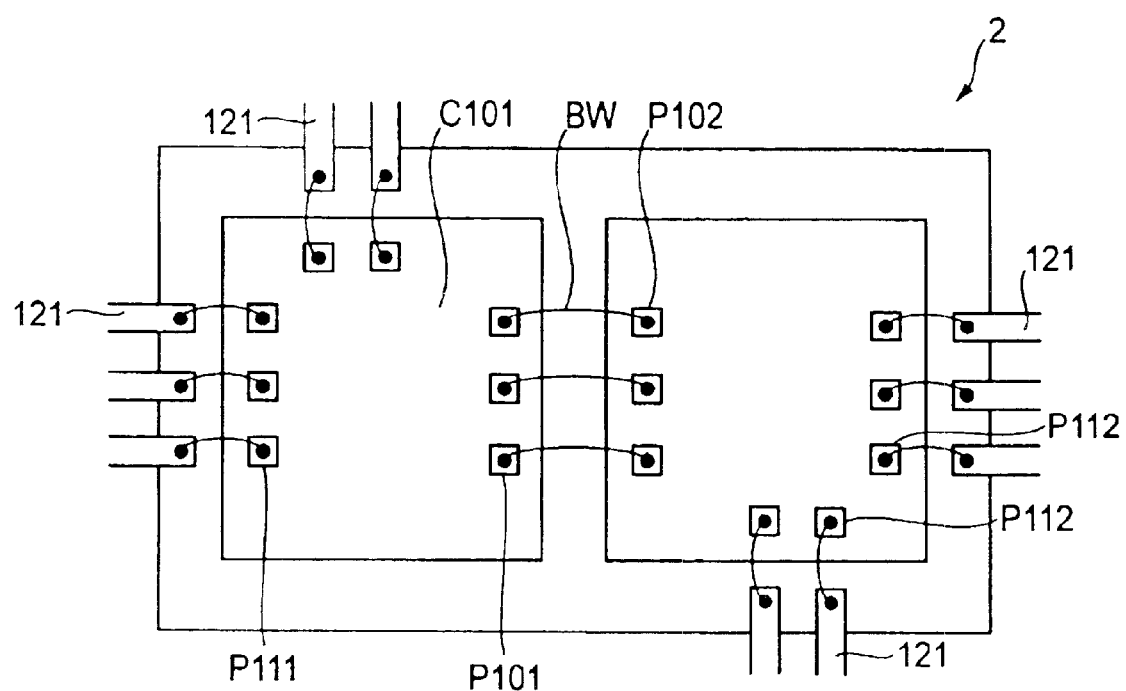
FIG. 8 is an internal plan view of another MCP semiconductor device in the related art.

According to the test circuit 450 of the fourth embodiment, in addition to the benefits of the second embodiment, since the test circuit 450 includes registers, each of which corresponds to one of the internal pads, and since the data stored in each register is compared to the data in the data stored in the test register, it is easy to identify the specific internal pad, which has a defects, from a plurality of the internal pads. Thus, by feedbacking this information as to the defective internal pad to circuit designers or to the manufacturers of an MCP semiconductor device, it is possible to change the design at the defective area and to improved the productivity of the MCP semiconductor device having no defects Fifth Preferred Embodiment Referring to FIG. 6, an MCP semiconductor device 500 includes a first chip C41 having a first test circuit TC41 and a second chip C42 having a second test circuit TC42. The first chip C41 and the second chip C42 are disposed on the same plane. The test circuit 550 is a combination of the first test circuit TC41 and the second test circuit TC42.

The first chip C41 further includes an internal pad P1a and an external pad P1f, and the second chip C42 further includes an internal pad P2a and an external pad P2f. The internal pads P1a, P2a are connected to each other by a bonding wire BWa. The external pad P1f is connected to an external terminal 411 such as a lead flame by a bonding wire BW1f, and the external pad P2f is connected to an external terminal 421 such as a lead flame by a bonding wire BW2f.

The first test circuit TC41 includes a first test mode control circuit 412, a first inverter 413 and a first analog switch SW41. The second test circuit TC42 includes a second test mode control circuit 422, a second inverter 423 and a second analog switch SW412.

The first analog switch SW41 includes a transfer gate, and selects connection or disconnection between the internal pad P1a and the external pad P1f. The first analog switch SW41 is controlled by a first test mode signal TM1 and the inverted signal of the first test mode signal TM1, which is generated by the inverter 413. When the mode of the MCP semiconductor device 500 is changed from the operation mode to the test mode by changing the voltage level of the first test mode signal TM1 from the L level to the H level, the first analog switch SW1 turns on. Therefore, in the test mode operation, the internal pads P1a is electrically connected to the external pads P1f, which is connected to an external terminals 411 of the lead frame, which is disposed outside of the MCP semiconductor device 500.

The second analog switch SW42 includes a transfer gate, and selects connection or disconnection between the internal pad P2a and the external pad P2f. The second analog switch SW42 is controlled by a second test mode signal TM2 and the inverted signal of the second test mode signal TM2, which is generated by the inverter 423. When the mode of the MCP semiconductor device 500 is changed from the operation mode to the test mode by changing the voltage level of the second test mode signal TM2 from the L level to the H level, the second analog switch SW2 turns on. Therefore, in the test mode operation, the internal pads P2a is electrically connected to the external pads P2f, which is connected to an external terminals 421 of the lead frame.

When the first test mode signal TM1 is at the L level, that is, the first chip C41 is in the operation mode, the first test mode control circuit 412 connects a first internal circuit 80 of the first chip C41 to the internal and external pads P1a, P1f, and controls the signal transmission between the internal and external pads P1a, P1f. When the second test mode signal TM2 is at the L level, that is, the second chip C42 is in the operation mode, the second test mode control circuit 422 connects a second internal circuit 90 of the second chip C42 to the internal and external pads P2a, P2f, and controls the signal-transmission between the internal and external pads P2a, P2f. Each of the first and second test mode control circuit 412, 422 can be formed of the first AND gate 38, the first 3-state buffer 39 and the inverter 39, each of which is disclosed in FIG. 3.

The normal operation mode is changed to the test mode operation by changing the voltage levels of the first and second test mode signals TM1, TM2 from the L level to the H level.

When the voltage level of the first test mode signal TM1 is changed from the L level to the H level, since the first analog switch SW1 in the first test circuit TC41 turns on, the internal pad P1a is connected to the external pad P1f electrically. Further, the internal and external pads p1a and p1f are disconnected from the first internal circuit 80 electrically by the first test mode control circuit 412.

When the voltage level of the second test mode signal TM2 is changed from the L level to the H level, since the second analog switch SW2 in the second test circuit TC42 turns on, the internal pad P2a is connected to the external pad P2f electrically. Further, the internal and external pads p2a and p2f are disconnected from the second internal circuit 90 electrically by the second test mode control circuit 422. Thus, the external pads P1f, P2f are connected electrically to each other via the internal pads P1a, P2a and the bonding wire BWa in the test mode operation.

In this state, if a test mode signal having a predetermined voltage level is applied to the external pad P1f, the test mode signal is outputted from the external pad P2f as it is when circuits between the external pads P1f, P2f has no defects. However, if a current leakage-pass is formed at one of or all of the internal pads P1a, P2a and their peripheral circuit by damaging the chips C41, C42, the signal having a voltage level, which is different from that of the test mode signal provided to the external pad P1f, is outputted from the external pad P2f.

According to the test circuit 550 of the fifth embodiment, by measuring the voltage level of the signal outputted from the external pad P2f, and then, by comparing it to the voltage level of the test mode signal provided to the external pad P1f, it is possible to find the existence of the defective internal pads or the defective peripheral circuits between the external pads P1f, P2f rapidly.

Further, although the test circuit 550 is used to the MCP semiconductor device 500 having the first chip C41 and the second chip C42, which are disposed on the same plane, the test circuit 550 can be applied to an MCP semiconductor device having the first chip and the second chip, which are stacked to each other.

While the present invention has been described with reference to illustrative embodiments, this description is not intended to be construed in a limiting sense. Various other modifications of the illustrated embodiments, as well as other embodiments of the invention, will be apparent to those skilled in the art on reference to this description. For example, in the first, second, and fourth embodiment, although each of the first test circuits TC1, TC11 includes test registers corresponding to the internal pads P1a1–P1a4, P1b1–P1b4 one by one, it is possible to remove the test registers. In this case, the test circuit, which provide the test mode signal to the internal pads P1a1–P1a4, P1b1–P1b4 from the external terminal may be formed in the first test circuits TC1, TC11, as well as the test circuits disclosed in the third and fifth embodiments. Moreover, when the mode transfer of an MCP semiconductors device from/to the test mode operation to/from the normal operation is controlled by the first and second test mode signals TM1, TM2 having the same voltage level or a related voltage level, the first and second test mode signals TM1, TM2 may be formed from a single signal. Therefore, the appended claims are intended to cover any such modifications or embodiments as fall within the true scope of the invention.

According to the invention, a leakage current at the internal pads formed on the first chip and at the internal pads on the second chip can be measured. Further, under the measurement of the leakage current, each of the internal pads are disconnected form the first and second internal circuits. Therefore, a high accurate measurement result can be obtained.

We claim:

1. A multi-chip package type semiconductor device having a first semiconductor chip, which has a first internal circuit and a plurality of first internal terminal pads for transmitting signals to or from the first internal circuit, and a second semiconductor chip, which has a second internal circuit and a plurality of second internal terminal pads for transmitting signals to or from the second internal circuit for transmitting signals, and each second internal terminal pad being connected to one of the first internal terminal pads electrically, comprising:

a test circuit, responsive to a voltage level of a test mode signal, selecting one from between operations for prohibiting signal transmission between the first internal circuit and the first internal terminal pads and for allowing signal transmission between the first internal circuit and the first internal terminal pads, and for selecting one from between operations for prohibiting signal transmission between the second internal circuit and the second internal terminal pads and for allowing signal transmission between the second internal circuit and the second internal terminal pads, the test circuit including a detection circuit wherein the detection circuit receives a signal outputted from each of the first or second internal terminal pads, detects whether a voltage level of the signal is identical to a predetermined voltage level, and outputs a result of the detection.

2. A multi-chip package type semiconductor device as claimed in claim 1, wherein the test mode signal includes a first test mode signal and a second test mode signal, and wherein the test circuit includes a first test control circuit formed on the first semiconductor chip, the first control circuit responsive to the first test mode signal for selecting one from between the operations for prohibiting signal transmission between the first internal circuit and the first internal terminal pads and for allowing signal transmission between the first internal circuit and the first internal terminal pads; and a second test control circuit formed on the second semiconductor chip, the second test control circuit responsive to the second test mode signal for selecting one from between the operations for prohibiting signal transmission between the second internal circuit and the second internal terminal pads and for allowing signal transmission between the second internal circuit and the second internal terminal pads.

3. A multi-chip package type semiconductor device as claimed in claim 2, further including a detection circuit, which is disposed on one of the first an second semiconductor chips.

4. A test circuit incorporated in a multi-chip package type semiconductor device, the multi-chip package type semiconductor device including a first semiconductor chip and a second semiconductor chip, the first semiconductor chip having a first internal circuit and a plurality of first internal terminal pads for transmitting signals to and from the first internal circuit, a second semiconductor chip having a second internal circuit and a plurality of second internal terminal pads for transmitting signals to and from the second internal circuit for transmitting signals, and each second internal terminal pad being connected to one the first internal terminal pads electrically, the test circuit comprising:

a first test control circuit formed on the first semiconductor chip, the first test control circuit responsive to a first test mode signal for selecting one from between operations for prohibiting signal transmission between the first internal circuit and the first internal terminal pads, and for allowing signal transmission between the first internal circuit and the first internal terminal pads; and a second test control circuit formed on the second semiconductor chip, the second test control circuit responsive to a second test mode signal for selecting one from between operations for prohibiting signal transmission between the second internal circuit and the second internal terminal pads and for allowing signal transmission between the second internal circuit and the second internal terminal pads, and a detection circuit, which is disposed on one of the first and second semiconductor chip, receiving a signal outputted from each of the first or second internal terminal pads, detecting whether a voltage level of the signal is identical to a predetermined voltage level, and outputting a result of the detection.

* * * * *